Jan. 7, 1964 B. JACOBS 3,117,067

METHOD OF MAKING SEMICONDUCTOR DEVICES

Original Filed June 3, 1957

INVENTOR
BERNARD JACOBS
BY
ATTORNEY

United States Patent Office 3,117,067

Patented Jan. 7, 1964

3,117,067
METHOD OF MAKING SEMICONDUCTOR DEVICES

Bernard Jacobs, Norwalk, Conn., assignor to Sperry Rand Corporation, a corporation of Delaware Original application June 3, 1957, Ser. No. 663,078, now Patent No. 2,945,285. Divided and this application June 20, 1958, Ser. No. 743,343
5 Claims. (Cl. 204—141)

The present application is a division of patent application Serial No. 663,078, filed June 3, 1957, in the name of Bernard Jacobs, now Patent No. 2,945,285, and assigned to the present assignee.

This invention relates to improvements in the art of making semiconductor devices such as contact rectifiers and transistors of the junction type, and is particularly adapted, though not exclusively so, to the fabrication of semiconductor devices wherein silicon is used as the principal constituent of the base material.

A problem in the fabrication of semiconductor devices is that of removing material that overlaps the asymmetrically conductive junctions and tends to degrade or prevent operation of the device. In the past, the overlapping material has been removed by etching the peripheral area of the junction. Chemical etching has the disadvantage that it acts on the entire silicon surface and parts that may be assembled with it at the time of etching. Electrolytic etching as practiced heretofore and described in Handbook of Semiconductor Electronics, Lloyd P. Hunter, McGraw-Hill Book Company, Inc., New York, 1956, page 8–4, enables preferential etching, but is not fully effective because cations from the electrolyte are deposited on the junction when the current is turned off, shorting the junction almost as badly as the overlap that is removed.

The principal object of this invention is to provide an improved method of electrolytically etching a junction whereby the redeposition of ions from the electrolyte onto the junction is prevented.

The above object is attained by reducing the concentration of the electrolyte while maintaining the polarizing voltage, until the electrolyte becomes substantially pure distilled water. This procedure prevents redeposition of ions from the electrolyte and leaves the junction free of short-circuiting agents.

Figure 1:
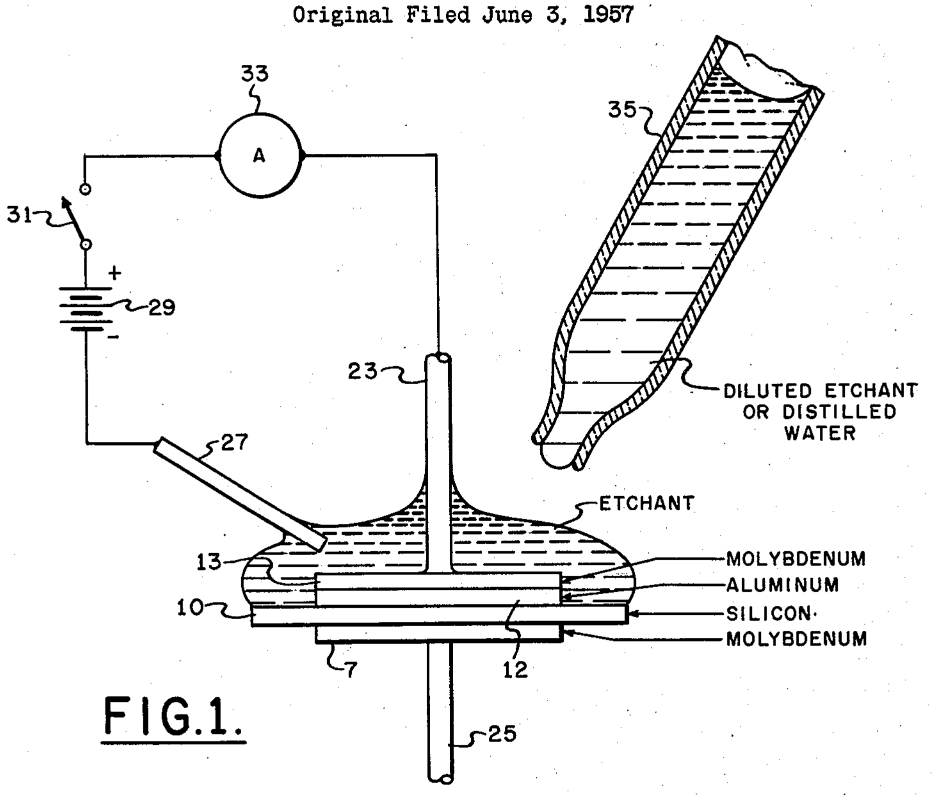
Figure 2:
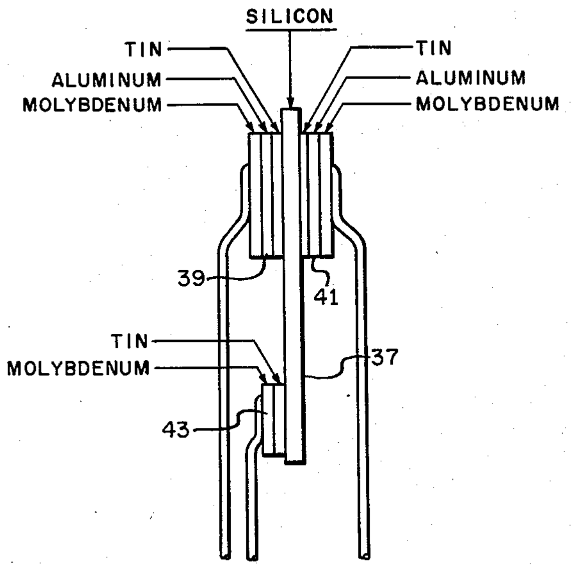

The invention will be described with reference to the accompanying drawings, wherein:

FIG. 1 illustrates the operation of etching a junction to remove the overlap, and FIG. 2 shows a silicon transistor made by the method of the present invention.

After making alloy or fusion junctions by the methods described in Section 7–6, page 7–16 of Handbook of Semiconductor Electronics, it is usually found that some of the material used in the fusing operation has flowed out and formed bridges between the semiconductor wafer and the adjacent contact elements, short circuiting the junction at the periphery. Also, it is found that high leakage paths resulting from minor imperfections in the junction occur mostly at the periphery. The usual procedure in manufacturing semiconductor devices is to etch away a portion of the peripheral region of the junction to remove the above defects.

Simple chemical etching has the disadvantage of removing material from all exposed surfaces of the devices, including contact elements and lead wires or anything else that may be part of the sub-assembly at the time of etching.

Electrolytic etching has also been used, by placing the assembly in a suitable electrolyte and maintaining the semiconductor at a positive potential. The material to be removed is thereby deposited upon a cathode element immersed in the electrolyte. This method enables selective etching by proper biasing of the junction. However, it has the disadvantage that when the current is turned off, cations in the solution tend to redeposit a metallic layer upon the etched region, forming short circuits that are nearly as bad as the ones that were etched away.

In the practice of the present invention, redeposition is prevented by removing the electrolyte before disconnecting the current source. Referring to FIG. 1, a wafer stack consisting of molybdenum wafers 7 and 13, an aluminum wafer and a silicon wafer is set forth as an example for teaching the present invention. The wafer stack has been provided with lead-in wires 23 and 25 soldered or otherwise secured to the molybdenum contact wafers 13 and 7 and has been formed by the fusion method mentioned above. Therefore, as is intrinsic with semiconductor devices formed by this method, there are peripheral short circuits between the aluminum and silicon wafers which must be etched away. Either or both of these wires may be used in supporting the assembly with the wafers in approximately horizontal position as shown. A small quantity of etchant solution, for example a solution of ammonium bifluoride, which is disclosed as an etchant solution in U.S. Patent 2,742,416, issued April 17, 1956, is placed on the assembly in such manner as to cover the peripheral region of the junction. A sufficient quantity is retained in place by surface tension, as indicated. The etchant may cover all or part of the electrode members 12 and 13 as shown, or may, under suitable conditions, be disposed only in a ring-shaped region around the periphery of the interfacial region between the silicon and aluminum wafers.

A cathode 27, which may be made of platinum, gold, or any other conductor insoluble in the etchant solution, is immersed in the solution and is connected to the negative terminal of a D.C. source 29. The positive terminal of the source 29 is connected through a switch 31 and a current meter 33 to the wire 23.

When the switch 31 is closed, material is removed from the exposed surface around the edge of the junction by electrolysis. By adjustment of the voltage of the source 29, the electrolytic action can be more or less restricted to the material that bridges the silicon-aluminum junction, so that the rest of the device is not etched to any undesirable extent. After the etching is complete, the electrolyte is displaced, carrying with it the ions that remain in it, by the addition of distilled water or of etchant which is progressively diluted with distilled water. The diluent may be added drop by drop as indicated by the dropper 35.

As the electrolyte becomes more dilute, its conductivity decreases, as shown by progressive reduction in the current indicated by the meter 33. When the etchant has been completely displaced by distilled water, the meter will indicate substantially the conductivity of the distilled water and the switch may be opened and the unit dried. The device is then ready for testing and encapsulation or mounting in a suitable sealed holder.

Silicon diodes made as described above and of the above-mentioned dimensions have shown a conductance in the forward direction of 50 amperes at one volt, and in the backward direction 3 microamperes at one hundred volts.

Although the invention has been described with reference to the making of a particular type of silicon diode, it is equally applicable to other junction semiconductor devices, for example, transistors. FIG. 2 shows a transistor of the p-n-p type, using silicon as the base electrode 37, and aluminum as the electrodes 39 and 41 forming asymmetrically conductive junctions with the base. The fusing and etching operations may be the same as in the case of the diode. The transistor ohmic contact 43 requires no etching.

The same methods of fusing and etching can be used with other base materials and with electrode materials other than those in the above examples.

While the invention has been described in its preferred embodiment, it is to be understood that the words which have been used are words of description rather than of limitation and that changes within the purview of the appended claims may be made without departing from the true scope and spirit of the invention in its broader aspects.

What is claimed is:

1. The method of removing conductive material that bridges the junction between the semiconductor and the counter electrode of a semiconductor device, comprising the steps of immersing the junction in an electrolyte which is capable of electrolytically etching said junction, immersing a cathode in the electrolyte, applying a voltage between said semiconductor device and said cathode to pass an electric current through said electrolyte and remove said conductive material from said junction, and, when said conductive material has been substantially removed, progressively diluting the electrolyte with distilled water while maintaining said voltage until the conductance of remaining liquid is substantially that of distilled water.

2. The method of removing conductive material from the periphery of a junction between a semiconductor and a counter electrode, comprising the steps of immersing the junction in an electrolyte which is capable of electrolytically etching said junction, immersing a cathode in the electrolyte, applying a voltage between said semiconductor device and said cathode to pass an electric current through said electrolyte and remove said conductive material from said junction, and, when said conductive material has been substantially removed, progressively substituting distilled water for the electrolyte while maintaining said voltage to prevent redeposition of said conductive material across said junction upon removal of said voltage.

3. The method of electrolytically etching a semiconductor device to remove conductive material that bridges the junction between the semiconductor and the counter electrode, comprising the steps of immersing the junction in an electrolyte which is capable of electrolytically etching said junction, immersing a cathode in the electrolyte, applying a voltage between said semiconductor device and said cathode to pass an electric current through said electrolyte and remove said conductive material from said junction, and, when said conductive material has been substantially removed, progressively substituting distilled water for the electrolyte while maintaining said voltage to prevent redeposition of said conductive material across said junction upon removal of said voltage.

4. The method of preventing redeposition of conductive material on a semiconductor junction after removal of said material by electrolytic etching, comprising the steps of progressively diluting the electrolyte with distilled water while maintaining application of the etching voltage until the current flowing in response to said voltage has diminished to a value corresponding to substantially complete replacement of said electrolyte by distilled water.

5. The method of preventing redeposition of conductive material on a semiconductor junction after removal of said material by electrolytic etching, comprising the steps of maintaining application of the etching voltage while progressively displacing the electrolyte with distilled water and thereby diluting the remaining electrolyte until said electrolyte has been substantially completely replaced by distilled water.

References Cited in the file of this patent

UNITED STATES PATENTS

| | | |
|---|---|---|
| 2,697,052 | Dacey et al. | Dec. 14, 1954 |
| 2,783,197 | Herbert | Feb. 26, 1957 |
| 2,791,553 | Connor et al. | May 7, 1957 |
| 2,797,193 | Eigler et al. | June 25, 1957 |
| 2,802,159 | Stump | Aug. 6, 1957 |
| 2,902,419 | Carasso et al. | Sept. 1, 1959 |